United States Patent [19]

Carter

[11] Patent Number: 4,527,850
[45] Date of Patent: Jul. 9, 1985

[54] ZERO INSERTION FORCE SOCKET

[75] Inventor: Clyde T. Carter, Shermans Dale, Pa.

[73] Assignee: Sealectro Corp., Mamaroneck, N.Y.

[21] Appl. No.: 556,030

[22] Filed: Nov. 29, 1983

[51] Int. Cl.³ .............................................. H01R 13/62
[52] U.S. Cl. ............................ 339/75 M; 339/176 M; 339/17 CF
[58] Field of Search .......... 339/75 M, 75 MP, 17 CF, 339/176 M

[56] References Cited

U.S. PATENT DOCUMENTS

| | | | |
|---|---|---|---|
| 3,883,207 | 5/1975 | Tomkiewicz | 339/75 M |
| 4,245,877 | 1/1981 | Auriana | 339/17 CF |
| 4,354,718 | 10/1982 | Bright et al. | 339/17 CF |
| 4,402,563 | 9/1983 | Sinclair | 339/75 M |
| 4,406,508 | 9/1983 | Sadigh-Behzadi | 339/75 M |
| 4,418,974 | 12/1983 | MacDougall | 339/75 M |
| 4,420,207 | 12/1983 | Nishikawa | 339/75 M |

FOREIGN PATENT DOCUMENTS

| | | | |
|---|---|---|---|
| 1152765 | 5/1969 | United Kingdom | 339/17 CF |
| 2039160 | 7/1979 | United Kingdom | 339/75 M |

Primary Examiner—Gil Weidenfeld
Assistant Examiner—Thomas M. Kline
Attorney, Agent, or Firm—Anthony J. Casella; Gerald E. Hespos

[57] ABSTRACT

A zero insertion force connector is provided for a dual-in-line integrated circuit package. The connector includes a base, a plurality of spring loaded contacts mounted in recesses extending along opposed sides of the base, and a frame which surrounds and is slidably mounted on the base. The recesses in which the contacts are mounted correspond in number and spacing to the leads on the integrated circuit package. The frame is slidably movable between extreme raised and lowered positions, and includes cam fingers aligned with the respective contacts. The frame is constructed such that in its lower position the cam fingers thereof urge the leads of the integrated circuit package against the contacts mounted in the base.

13 Claims, 8 Drawing Figures

ZERO INSERTION FORCE SOCKET

BACKGROUND OF THE INVENTION

A secure mechanical engagement is necessary to achieve a good electrical connection between a lead of an electrical component and a corresponding socket. In many connectors, the lead and the electrical contacts of the socket are biased against one another when the lead is fully seated in the socket. Thus as the lead is being inserted in or removed from the socket the biasing force must be overcome.

Although the above described electrical connectors are acceptable for many applications, there are other applications where the biasing force encountered as the lead is inserted into the socket may damage the lead or an electrical component connected to the lead. Specifically, many dual-in-line integrated circuit (IC) packages, computer chips having leads extending from four sides or small transistors with concentrically arranged leads are sufficiently fragile to create a possibility of damage as the leads are inserted in or removed from a socket. Damage is particularly likely to occur if an IC package, for example, is twisted even slightly to overcome the biasing force during removal of the IC package from the socket.

IC packages and other such components frequently are used with zero insertion force connectors to avoid any damage that might be incurred as the IC package is inserted in or removed from a socket. Zero insertion force connectors are generally constructed with movable electrical contacts. More particularly the contacts on the zero insertion force connector can be moved into a position where they will not touch the leads of the IC package. As a result, the IC package can be placed in or removed from the zero insertion force connector without encountering the biasing forces of the contacts in the connector. However, once the IC package is in position the electrical contacts of the zero insertion force connector can be moved into mechanical and electrical engagement with the leads.

A variety of zero insertion force connectors have been developed for use with dual-in-line integrated circuit packages. Typically, the known zero insertion force connector comprises a base member into which a plurality of electrical contacts are placed, a cover member which at least partially covers and retains the electrical contacts, and one or more cam members which are movable between the cover and base to force the individual electrical connectors into contact with the pins of the IC package.

One specific zero insertion force connector is shown in U.S. Pat. No. 4,080,032 which issued to Cherian et al. The connector shown in U.S. Pat. No. 4,080,032 includes a base, a cover, a draw bar and a pair of chanel shaped actuator members. The draw bar and actuator members each contain a plurality of cooperating ramps and slots. A longitudinal movement of the draw bar shown in the device of U.S. Pat. No. 4,080,032 is translated into a lateral movement of the actuator members by virtue of the cooperation between the ramps on the respective members. This lateral movement of the actuator members, in turn, causes the electrical contacts to be open or closed.

Another zero insertion force connector is shown in U.S. Pat. No. 4,314,736 which issued to Demnianiuk. The connector shown in U.S. Pat. No. 4,314,736 also includes a base and a cover, and achieves a camming action through cooperation of a rotating lever, camming arms and engaging arms. More particularly rotation of the lever in the connector of U.S. Pat. No. 4,314,736 is translated into a lateral movement of the engaging bars which, in turn, moves the electrical contacts toward or away from the individual pins.

Still another type of zero insertion force connector is disclosed in U.S. Pat. No. 3,891,289 which issued to Hanke. The connector shown in U.S. Pat. No. 3,891,289 uses a centrally located, generally eliptically configured cam which is rotatable about an axis which extends generally perpendicular to the contact. Rotation of this eliptical cam can urge the connectors into contact with the pins. U.S. Pat. No. 3,568,134 which issued to Anhalt et al shows a connector similar to the one described in U.S. Pat. No. 3,891,289.

Finally another known connector has a housing into which a plurality of contacts are loosely placed. Each contact includes a pair of generally parallel arms which are spaced apart such that the pin of an IC package can be inserted therebetween. An actuator is telescopingly mounted on the housing and connected to the housing by four jack screws. In use the pins of the IC package are loosely positioned between the arms of the respective contacts. The jacks screws then are rotated to draw the actuator toward the housing in a direction generally parallel to the pins and the contact arms. This movement causes the actuator to press down on one arm of each contact, causing that arm to bend toward and touch the pin. This structure would be costly to manufacture and difficult to operate because of the screws. Additionally the ability of the loosely mounted contacts to move freely makes proper mounting of the IC package difficult, and can result in damaged pins. Furthermore the actuator tends to cause the arms to lose their resiliency so that they may remain in a closed position or may not adequately contact the pin.

Although some of the above described zero insertion force connectors have generally satisfactory electrical performance, they are relatively expensive to make, difficult to assemble, and cumbersome to operate. More particularly the requirement of a relatively great number of cooperating parts substantially contributes to manufacturing costs and assembly time. Additionally, since the IC packages with which the prior art connectors typically are used are quite small, the connectors and the cams mounted therein are comparably small. This small size makes manipulation of the small cam member difficult to accomplish.

Accordingly it is an object of the subject invention to provide a zero insertion force connector which has few moving parts and is not likely to damage electrical contacts or pins.

It is an additional object of the subject invention to provide a zero insertion force connector which can be operated without special tools.

It is a further object of the subject invention to provide a zero insertion force connector which will securely retain electrical contacts.

It is still an additional object of the subject invention to provide a zero insertion force connector which can be manufactured, assembled, and operated easily and at a low cost.

SUMMARY OF THE INVENTION

The subject connector can be used with virtually any electrical component, such as dual-in-line IC packages, rectangular chips having leads on four sides or circular transistors and the like with circumferentially arranged leads. The only limitation is that the leads or pins of the component be substantially symmetrically arranged to yield substantially balanced forces when subject connector is actuated or released. To facilitate the following explanation, however, the subject connector is described primarily with reference to a dual-in-line IC package. A person skilled in this art could readily adapt this connector for other shapes.

The subject zero insertion force connector includes a base having a plurality of contact mounting portions for receiving electrical contacts. The contact mounting portions are arranged symmetrically along the sides of the base. The number and spacing of the contact mounting portions corresponds to the number and spacing of the leads on the electrical component with which the subject connector is used. Additionally, the spacing between the rows of contacts mounted to the base is such that when a component is placed on the base the leads of the component lie substantially adjacent but not in contact with the electrical contacts mounted in the base. Preferably, as explained further below, the electrical contacts mounted in the base are disposed interiorly of the leads on the component.

The subject zero insertion force connector further includes a frame configured to slide over and substantially surround the base. The frame includes a plurality of inwardly directed camming members which are arranged in parallel rows to be aligned with the contacts in the base. The frame and base also preferably include interengaging detents which enable the frame to be locked into one or more contacting and release positions with respect to the base. Furthermore in certain embodiments the frame and base include interengaging grooves and ridges to prevent deformation of the frame.

In use an electrical component such as an IC package is positioned on the base prior to urging the frame into its final locked condition with respect to the base. In this initial position, as noted above, the leads of the IC package are substantially adjacent to, but not touching, the electrical contacts in the base. The frame is then lowered onto the base, causing the camming members to be slid or wiped against the leads thereby gradually urging the leads inwardly into secure electrical connection with respective contacts. There is virtually no change of damage to leads or contacts. The detents enable the frame to be locked into this position on the base to securely ensure good electrical connections between the leads and the contacts during virtually all operating conditions.

The subject zero insertion force socket includes only two moving parts thereby minimizing manufacturing costs and facilitating assembly and operation. Additionally, the camming fingers are located on the frame, which is the largest part of the subject connector. As a result the cam can be manipulated easily without special tools. However, as explained in greater detail below, the frame and base can be constructed to facilitate movement therebetween by use of a screwdriver or other simple tool.

DETAILED DESCRIPTION OF THE PREFERRED EMBODIMENT

Figure 1:
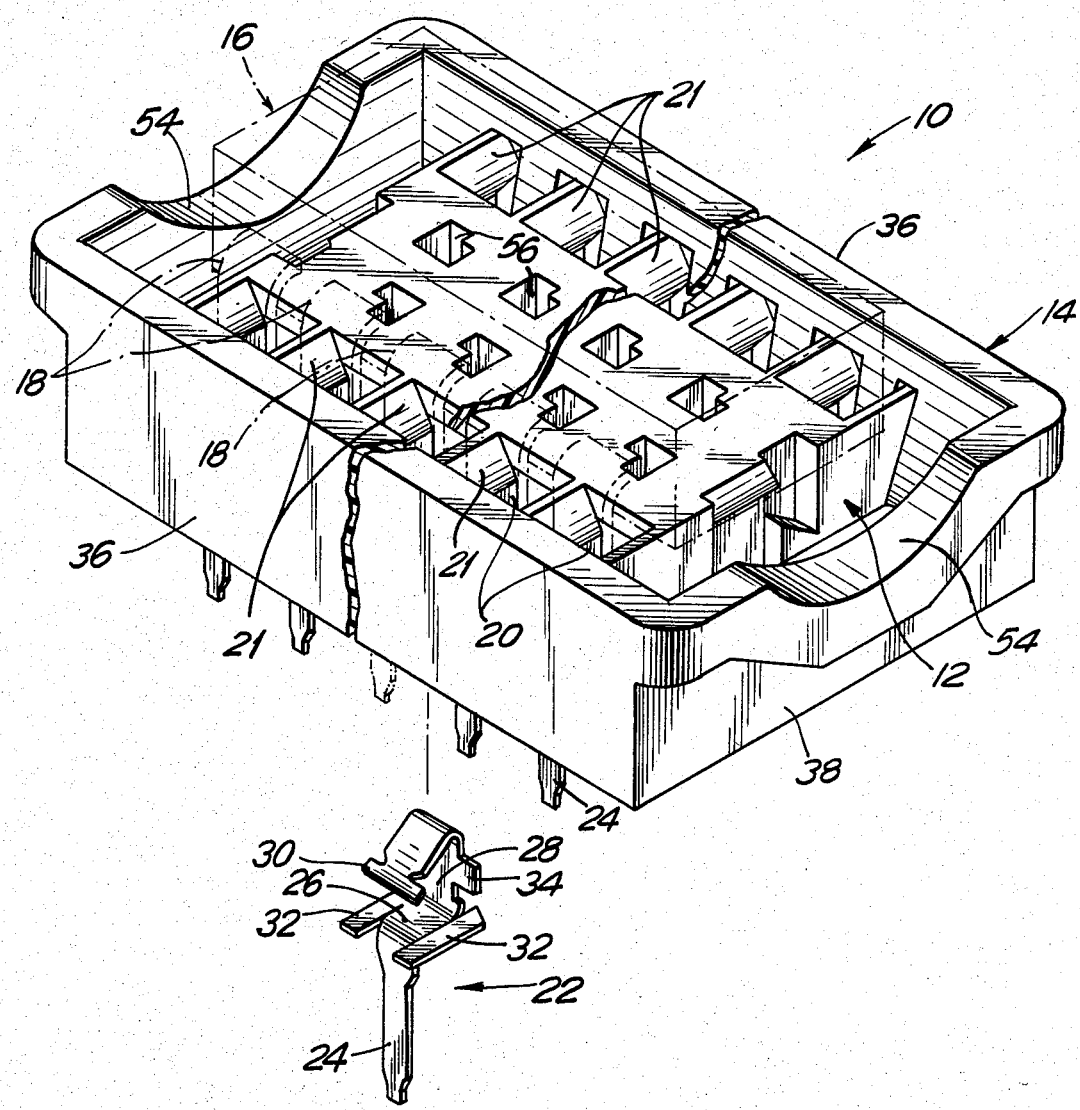
FIG. 1 is an exploded perspective view of the zero insertion force connector of the subject invention.

The zero insertion force connector of the subject invention is indicated generally by the numeral 10 in FIG. 1. The connector 10 includes a base 12 and a frame 14, and is adapted to securely retain a dual-in-line IC package 16. The IC package 16 is of standard construction including a plurality of leads 18 disposed in parallel rows along opposite sides of the IC package 16. The distance between the outermost extremities of the leads 18 on opposed sides of the IC package 18 is indicated by dimension "a" in FIG. 3.

The base 12 is of generally rectangular configuration and includes a plurality of recesses 20 disposed in parallel rows along opposed sides of the base 12. The number and spacing of recesses 20 corresponds to the number and spacing of leads 18 on the IC package 16. Recesses 20 are partly defined by pairs of angularly aligned surfaces 21 which help guide the leads 18 of the IC package 16 into proper position.

Each recess 20 is adapted to receive an electrical contact 22. Each contact 22 is formed from a piece of phospher bronze or beryllium copper alloy, and includes a pin 24, a seat 26, a back 28, a locking lance 29 and a contact lever 30. The pin 24 is connected to and extends perpendicularly from one edge of the seat 26. In use the pins 24 extend to or through a printed circuit board and are electrically connected to other components. The back 28 of the contact 22 is connected to and extends perpendicularly from an opposed edge of the seat 26. Thus, as shown in FIG. 1, the pin 24 and back 28 are generally parallel to one another and extend in opposite directions from the seat 26. The contact lever 30 is connected to and extends angularly from the edge of the back 28 opposite the seat 26. More specifically the contact lever 30 is angularly directed generally toward pin 24. A pair of seat supports 32 extend from opposite sides of the seat 26, and a pair of back supports 34 extend from opposite sides of the back 28. The locking lance 29 extends angularly from the back 28. As shown most clearly in FIGS. 3 and 4, as the contact 22 is inserted upwardly into the recess 20 the locking lance 29 is initially compressed toward back 28 by the walls of the recess 20, but then springs into locking engagement with ledge 35. Additionally insertion of the contact 22 into the recess 20 causes a spring loading of the contact lever 30 against the wall 31 of the recess 20. In this final position the contact lever 30 extends generally outwardly from the base 12.

Figure 3:
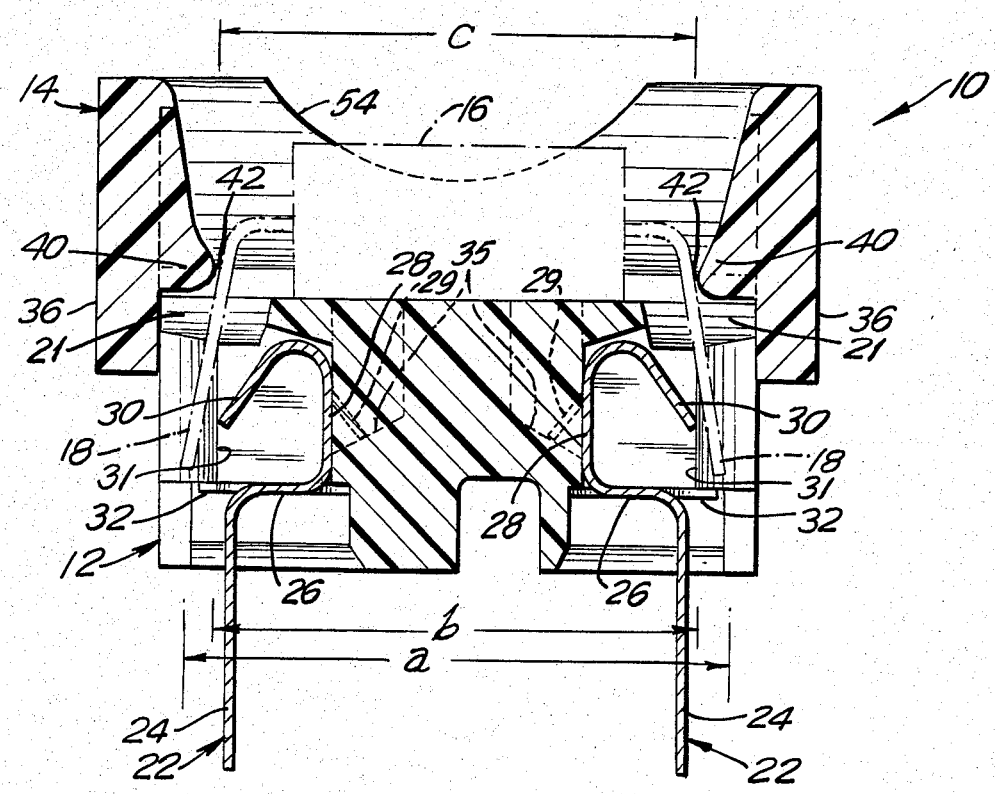
FIG. 3 is a cross-sectional view taken along line 3—3 in FIG. 2.

The spacing between the contact levers 30 on opposite sides of the base 12 is indicated by dimension "b" in FIG. 3. The spring loading of the contact levers 30 into their initial outwardly directed angular position results in biasing forces when the contact levers are moved inwardly into angular positions which differ from their initial position.

Figure 2:
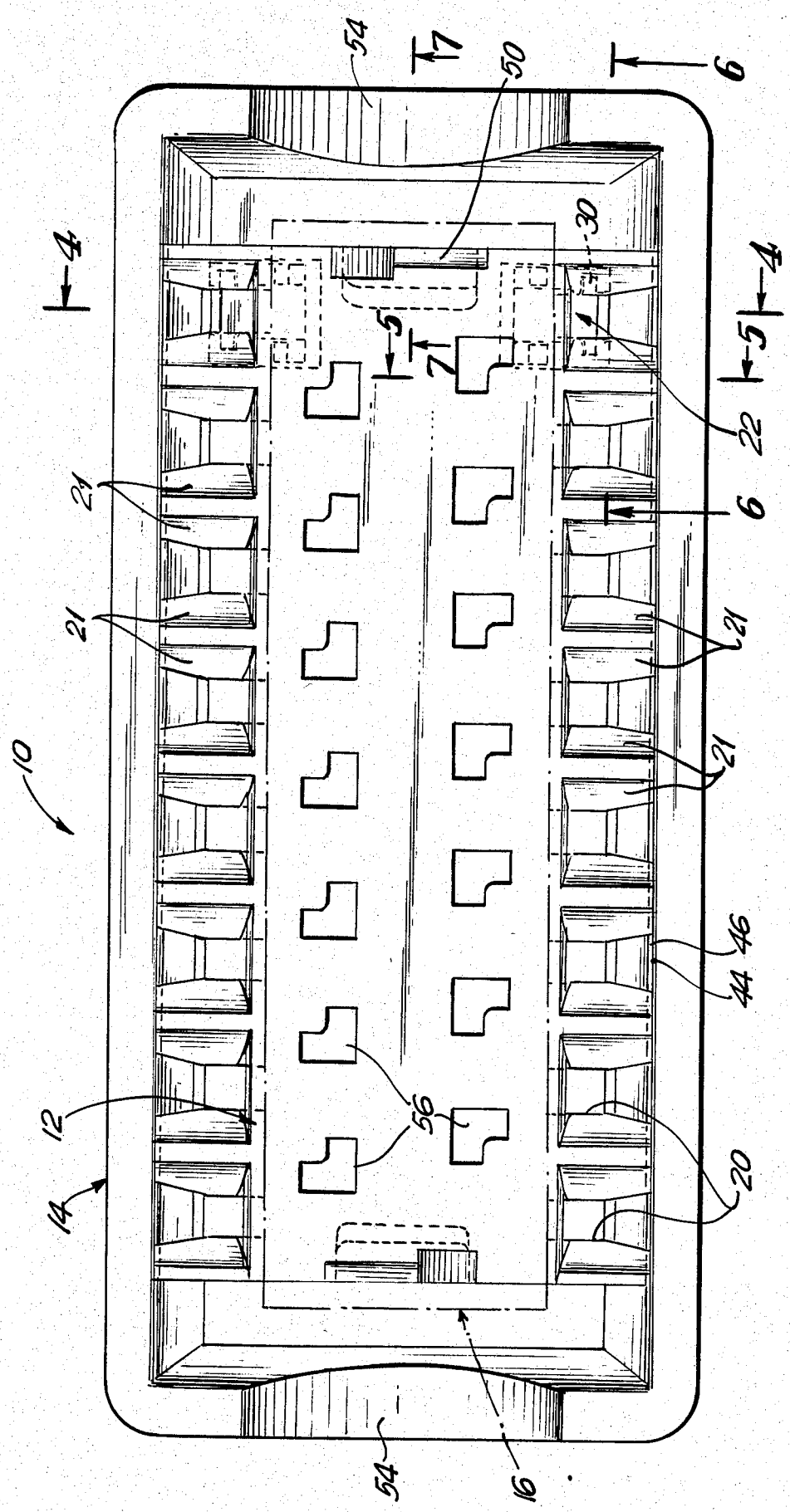
FIG. 2 is a top plan view of the subject zero insertion force connector.
Figure 4:
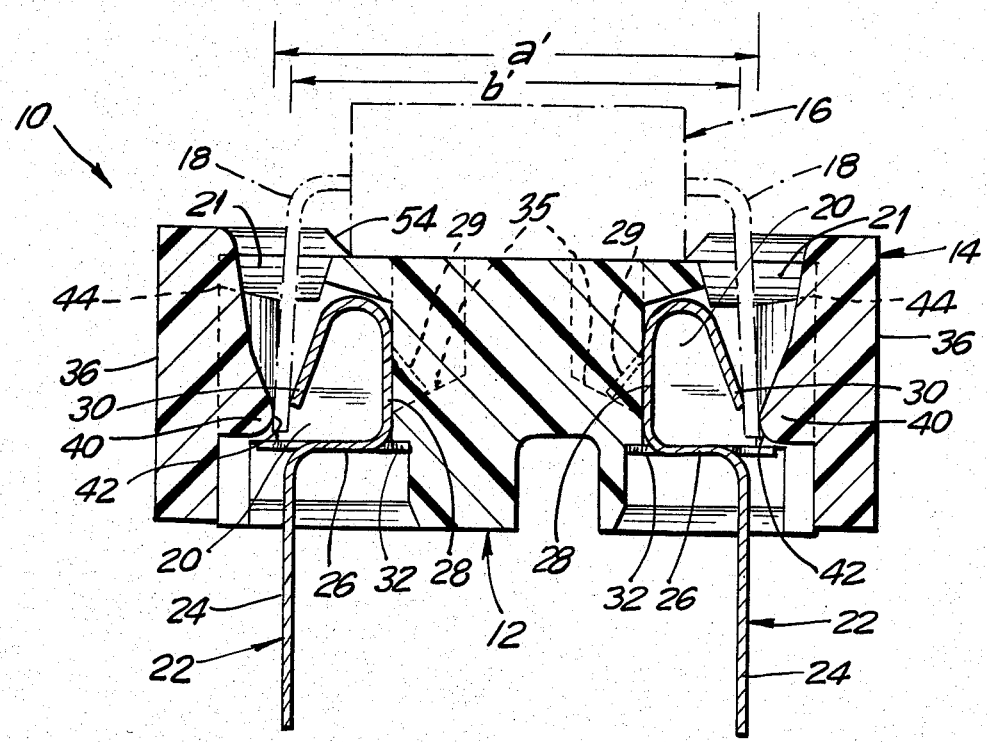
FIG. 4 is a cross-sectional view taken along line 4—4 in FIG. 2.

The frame 14 is generally rectangular and includes opposed sides 36 and opposed ends 38. The frame 14 is dimensioned to be slidably mounted over the base 12. As shown more clearly in FIGS. 2 through 4, the frame 14 includes a plurality of cam fingers 40. The cam fingers 40 are disposed along the sides 36 of frame 14 and are directed inwardly or toward one another. The number and spacing of the cam fingers 40 corresponds to the number and spacing of the leads 18 on the IC package 16. Each cam finger 40 includes a rounded end 42 which substantially prevents the cam fingers 40 from damaging the leads 18, and facilitates the wiping camming action. The distance "c" between cam fingers 40 on opposite sides 36 of the frame 14 is less than the distance "a" between opposed leads 18, and less than the distance "b" between the contact levers 30 on opposed contacts 22. As a result of this construction, when the frame 14 is slid down over the base 12, the cam fingers 40 slide into contact with the leads 18 and urge the leads 18 inwardly with respect to base 12 into secure electrical contact with the contact lever 30 of opposed contacts 22. Thus, as the cam fingers 40 are moved into their final position as shown in FIG. 4, opposed leads 18 and opposed contact levers 30 are closer together, as indicated by distances "a'" and "b'", than in their unbiased position, as shown in FIG. 3. The pre-loading of the contacts 22 causes the contact levers 30 to remain biased against both the leads 18 and the cam fingers 40. Thus a secure electrical connection is maintained. Furthermore the wiping contact and gradual inward force of cam fingers 40 on the leads 18 virtually eliminates any chance of damage to the leads 18 or contacts 22.

Figure 5:
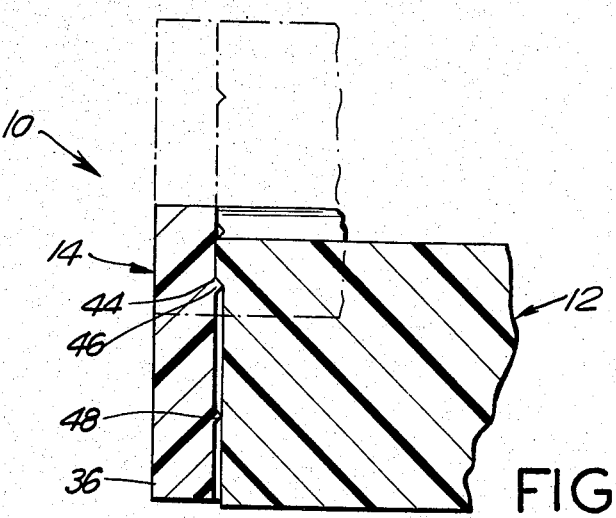
FIG. 5 is a cross-sectional view taken along line 5—5 in FIG. 2.

To further ensure a secure electrical connection between the leads 18 and the contacts 22, the base 12 is provided with a shoulder 44 between adjacent recesses 20 as shown most clearly in FIG. 5. The frame 14 includes detents 46 and 48 for cooperatively engaging the shoulder 44. More particularly, when the frame 14 is in its lower or contacting position with respect to the base 12, the upper detent 46 is engaged below shoulder 44, thereby requiring an upward force to move the frame 14 from its lower position. Thus, the frame 14 is not likely to become accidentally moved out of the position in which the cam fingers 40 urge the leads 18 against the contacts 22. The lower detent 48 on frame 14 supports the frame 14 in its raised or release position relative to base 12, as shown by the phantom lines in FIG. 5. This ability to support the frame 14 in its raised position facilitates mounting of the IC package 16. The detents 46 and 48 are dimensioned to enable the frame 14 to be locked in either of the extreme positions in FIG. 5, but also to enable movement of frame 14 without a great amount of force.

Figure 7:
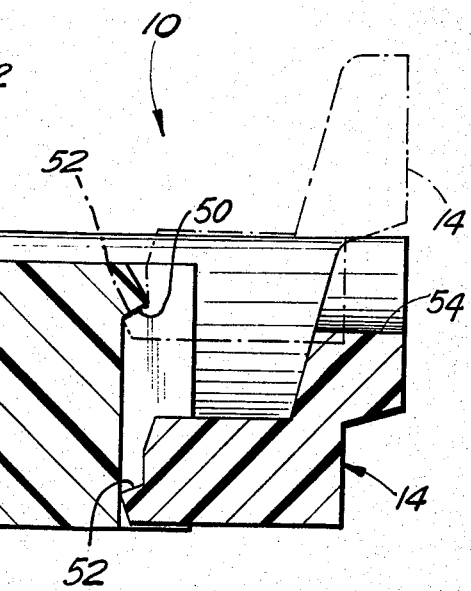
FIG. 7 is a cross-sectional view taken along line 7—7 in FIG. 2.

As shown most clearly in FIGS. 1 and 7, base and frame locking ledges 50 and 52 are provided to substantially prevent accidental complete removal of the frame 14 from the base 12. The base and frame locking ledges 50 and 52 are substantially larger than the above described detents 46 and 48, and thus require greater force and a slight deformation of frame 14 to disengage the frame 14 from the base 12. As noted above, a screw driver can be employed to facilitate movement and disengagement of the frame 14.

To further facilitate operation, assembly and disassembly of the connector 10, the frame 14 includes finger recesses 54 adjacent the opposed ends thereof. The finger recesses 54 are dimensioned and configured to facilitate grasping of the IC package 16 by a thumb and forefinger.

The base 12 includes apertures 56 which extend into the respective recesses 20. The apertures 56 can accept cores for forming the recesses 20 during the molding of the base 12.

In use, the frame 14 can be entirely removed from the base 12 to mount IC package 16 on the base. Alternatively, the frame 14 can be locked into its raised position when the IC package 16 is to be mounted on base 12. After the IC package 16 has been positioned on the base 12, the frame 14 is slidably moved over the base 12. This initial movement of the frame 14 requires the exertion of a force to urge the lower detent past the shoulder 44. As the frame 14 moves downwardly with respect to the base 12, the ends 42 of the respective cam fingers 40 come into a wiping contact with the corresponding leads 18 of the IC package 16. Continued downward movement of the frame 14 causes each cam 40 to urge its corresponding lead 18 into secure electrical connection with the corresponding contact 22. The frame 14 is locked in its lowermost position by the cooperation between the upper detent 46 and the shoulder 44. This final position causes the contact lever 30 to be biased inwardly from its initial pre-loaded condition, and this biasing force urges the contact lever 30 into secure electrical contact with the lead 18. All movement of the frame 14 can be carried out manually without the use of tools.

In cerain embodiments, such as a connector 10 constructed for a large IC package 16, there may be a tendency for the frame 14 to bow outwardly away the base 10. This bowing of the frame in extreme instances could affect the electrical connection between the pins 18 and contacts 20. One way to avoid such bowing is to provide a frame with sufficient strength to resist the forces which cause bowing. However this typically requires a larger and thus more costly frame 14.

Figure 8:
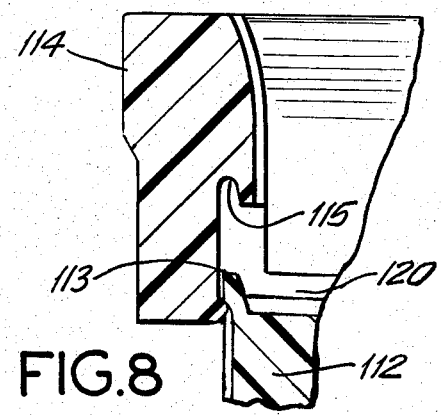
FIG. 8 is a cross-sectional view illustrating an alternate embodiment of the invention.
Figure 6:
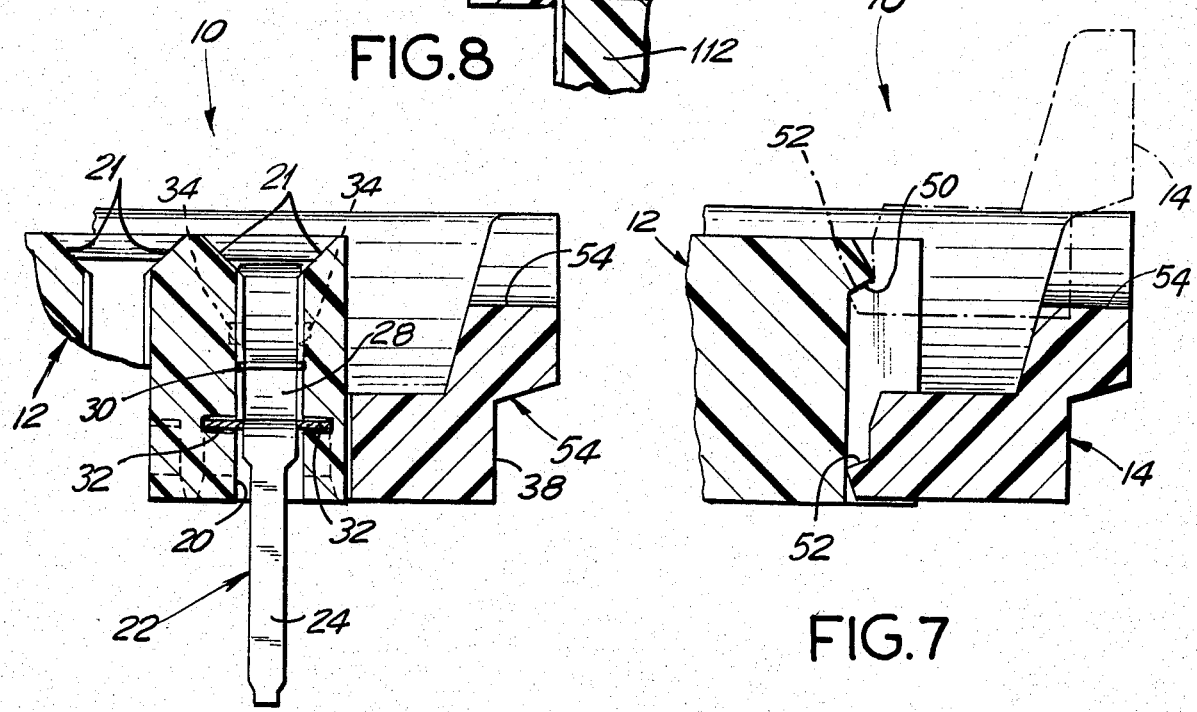
FIG. 6 is a cross-sectional view taken along line 6—6 in FIG. 2.

An alternate embodiment which prevents bowing is shown in FIG. 8 wherein the base 112 is provided with locking ridges 113 intermediate adjacent recesses 120. The frame 114 is provided with a downwardly facing groove 115 which is located and dimensioned to grasp the ridge 113 when the frame 114 is in its lowermost position. Preferably the surfaces which define ridge 113 and groove 115 respectively are aligned at an angle of about 15° to the direction of movement of the frame 114 over the base 112 to facilitate the interengagement.

In summary a zero insertion force connector is provided which includes a base, a plurality of contacts arranged in parallel rows in opposite sides of the base, and a frame which is slidably mounted over and around the base. The contacts are positioned in recesses along opposed sides of the base, with the recesses corresponding in number and spacing to the leads on an integrated circuit package. The contacts and the recesses are dimensioned such that when the IC package is placed on the base, the leads thereof are adjacent but do not touch the contacts. The frame includes a plurality of inwardly directed cam fingers. The dimensions of the cam fingers are such that when the frame is slid over the base the cam fingers urge the leads into the contacts. The contacts are pre-loaded to exert a continuous biasing force against the leads. The base and frame include cooperating detents and shoulders to lock the frame into either of its extreme positions with respect to the base.

While the preferred embodiment of the subject invention has been described and illustrated, it is obvious that various changes and modifications can be made therein without departing from the spirit of the present invention which should be limited only by the scope of the appended claims.

What is claimed is:

1. A zero insertion force connector for use with an electrical component having a body and symmetrically arranged downwardly extending leads connected to the body, said connector comprising:

a base having a plurality of mounting portions disposed symmetrically on said base, said mounting portions on said base corresponding in number and spacing to the leads on the electrical component;

a metallic contact securely mounted to each said mounting portion, each said contact including a spring loaded contact lever extending generally outwardly with respect to said base, said base and said contact being dimensioned such that the leads of said component can be mounted respectively substantially adjacent to and outwardly from said contact levers; and a frame mounted around said base and slidably movable to a contacting position and at least one release position with respect to the base, said frame including a plurality of inwardly directed cams aligned respectively with the mounting portions of the base, and said cams extending inwardly a sufficient distance to contact and urge the respective leads inwardly against the corresponding contact levers when the frame is in its contacting position with respect to the base; said base and said frame each include at least one ledge, said ledges on said base and said frame being positioned to engage one another when said frame is in said release position, whereby said ledges prevent unintentional removal of the frame from the base.

2. A connector as in claim 1 wherein said base includes at least one locking shoulder, and said frame includes at least one locking detent, said shoulder and said detent being positioned to lock said frame into its contacting position with respect to the base.

3. A connector as in claim 2 wherein said frame includes a plurality of said detents, with at least one said detent being positioned to lock the frame in said release position.

4. A connector as in claim 1 wherein said base and said frame each are substantially rectangular.

5. A connector as in claim 4 wherein said base includes an opposed pair of parallel sides and wherein the mounting portions are defined by recesses extending into said sides.

6. A connector as in claim 1 wherein each said cam includes an arcuate end for contacting the respective lead.

7. A connector as in claim 5 wherein said contact includes an elongated pin, a seat connected to and extending generally orthogonally from one end of said pin, a back connected to and extending generally orthogonally from said seat, and a locking lance extending angularly from said back, said contact lever being connected to said back and extending angularly therefrom toward said seat.

8. A connector as in claim 7 wherein said recess is dimensioned to engage said locking lance.

9. A connector as in claim 7 wherein said contact is formed from a unitary piece of electrically conductive metal.

10. A connector as in claim 1 wherein said frame includes a pair of finger recesses for facilitating movement of the component with respect to the base and the frame.

11. A connector as in claim 1 wherein said cams extend inwardly a sufficient distance to cause said contact levers to be biased away from their respective initial spring loaded positions when said frame is in its contact position and when said component is in place.

12. A connector as in claim 1 wherein said frame is formed from a unitary plastic member.

13. A zero insertion force connector for use with an electrical component having a body and symmetrically arranged downwardly extending leads connected to the body, said connector comprising:

a base having a plurality of mounting portions disposed symmetrically on said base, said mounting portions on said base corresponding in number and spacing to the leads on the electrical component;

a metallic contact securely mounted to each said mounting portion, each said contact including a spring loaded contact lever extending generally outwardly with respect to said base, said base and said contact being dimensioned such that the leads of said component can be mounted respectively substantially adjacent to and outwardly from said contact levers; and a frame mounted around said base and slidably movable to a contacting position and at least one release position with respect to the base, said frame including a plurality of inwardly directed cams aligned respectively with the mounting portions of the base, said cams extending inwardly a sufficient distance to contact and urge the respective leads inwardly against the corresponding contact levers when the frame is in its contacting position with respect to the base; said base including a locking ridge between adjacent mounting portions, and wherein said frame includes a groove dimensioned and located to engage said ridge when said frame is in the contacting position with respect to said base, whereby the engagement of the ridge by the groove prevents said frame from bowing away from said base.

* * * * *